(12) United States Patent
Ye et al.

(10) Patent No.: US 12,575,127 B2
(45) Date of Patent: Mar. 10, 2026

(54) TFET WITH OR-AND LOGIC FUNCTION

(71) Applicant: Wenzhou University, Zhejiang (CN)

(72) Inventors: Hao Ye, Zhejiang (CN); Pengjun Wang, Zhejiang (CN); Xuejie Zhang, Zhejiang (CN); Yijian Shi, Zhejiang (CN); Gang Li, Zhejiang (CN); Bo Chen, Zhejiang (CN); Zhening Shen, Zhejiang (CN)

(73) Assignee: Wenzhou University, Zhejiang (CN)

( * ) Notice: Subject to any disclaimer, the term of this patent is extended or adjusted under 35 U.S.C. 154(b) by 485 days.

(21) Appl. No.: 18/357,172

(22) Filed: Jul. 24, 2023

(65) Prior Publication Data

US 2024/0347639 A1 Oct. 17, 2024

(30) Foreign Application Priority Data

Apr. 14, 2023 (CN) ......................... 202310397263.X

(51) Int. Cl.
| | |
|---|---|
| *H10D 30/62* | (2025.01) |
| *H10D 30/63* | (2025.01) |
| *H10D 30/67* | (2025.01) |
| *H10D 62/13* | (2025.01) |
| *H10D 84/85* | (2025.01) |

(52) U.S. Cl.
CPC ......... *H10D 30/6211* (2025.01); *H10D 30/63* (2025.01); *H10D 30/6733* (2025.01); *H10D 30/6757* (2025.01); *H10D 62/153* (2025.01); *H10D 62/158* (2025.01); *H10D 84/853* (2025.01)

(58) Field of Classification Search
CPC ............... H10D 30/6211; H10D 30/63; H10D 30/6733–6736
See application file for complete search history.

(56) References Cited

U.S. PATENT DOCUMENTS

2021/0202752 A1* 7/2021 Simon .................... H10D 64/01

* cited by examiner

*Primary Examiner* — Daniel P Shook
(74) *Attorney, Agent, or Firm* — JCIPRNET

(57) ABSTRACT
Disclosed is a TFET with an OR-AND logic function. By arranging a horizontal channel and a vertical channel in different directions, three gates are not connected and will not be affected by each other, and can control the current of a whole channel jointly; when a first gate and a second gate are both at a high level, the TFET will be turned on, and when the first gate and a third gate are both at a high level, the TFET will also be turned on; the horizontal channel not only isolates the second gate from the third gate, but also reduces the strength of coupling between the second gate and the third gate, so only a small current passes through the horizontal channel when the second gate and the third gate are both at a high level, and the TFET will not be turned on at this moment.

2 Claims, 4 Drawing Sheets

TFET WITH OR-AND LOGIC FUNCTION

CROSS-REFERENCE TO RELATED APPLICATION

This application claims the priority benefit of China application serial no. 202310397263.X, filed on Apr. 14, 2023. The entirety of the above-mentioned patent application is hereby incorporated by reference herein and made a part of this specification.

BACKGROUND

Technical Field

The invention relates to TFETs, in particular to a TFET with an OR-AND logic function.

Description of Related Art

Tunnel field-effect transistors (TFETs) with band-to-band tunneling as the main carrier transport mechanism can realize sub-threshold swing less than 60 mV/dec, and are considered as one of the best choices of the next generation of logic devices because their manufacturing process is compatible with the standard CMOS process. Although the TFETs are faced with the problem of weak driving capacity and bipolarity, they show an enormous potential in low power consumption, thus being used to realize various logic gate.

Most traditional TFETs use a single-gate or a double-gate planar structure. Recently, some researchers propose a double-gate TFET which shows the specific Boolean logic behavior, for example, a two-input logic such as OR, AND, NOR, or NAND, and have proved that a compact two-input logic gate can be realized by reducing the number of transistors. Compared with two-input Boolean logic, three-input logic shows higher efficiency in logic network simplification because of its high expression capacity. Existing single-gate or double-gate TFETs cannot show a three-input logic switch behavior, so when they are used for designing a three-input basic logic gate circuit, the number of required transistors is still large. Basic three-input logic includes the Majority, OR-AND, and AND-OR logic function. If considering the minimum implementation unit, three or two transistors are respectively required for designing an OR-AND logic circuit that uses the existing single-gate or double-gate TFETs. Therefore, a large number of transistors are needed to realize the OR-AND logic circuit, which leads to high power consumption and a large area, which make it impossible to give a full play to the advantages of the three-input logic primitive.

SUMMARY

The technical issue to be settled by the invention is to provide a TFET with an OR-AND logic function. A single one of the TFET with the OR-AND logic function can realize a three-input OR-AND circuit, such that the number of transistors in the three-input OR-AND circuit is reduced while the power consumption is reduced as well.

The technical solution adopted by the invention to settle the above technical issue is as follows: a TFET with an OR-AND logic function comprises a substrate layer, a source region, a drain region and a channel region, and the channel region comprises a vertical channel and a horizontal channel; the TFET further comprises three metal layers and five gate-oxide layers, the three metal layers are referred to as a first metal layer, a second metal layer and a third metal layer respectively, the five gate-oxide layers are referred to as a first gate-oxide layer, a second gate-oxide layer, a third gate-oxide layer, a fourth gate-oxide layer and a fifth gate-oxide layer respectively, the source region, the vertical channel and the drain region are distributed on the substrate layer from left to right and are all rectangular, lower surfaces of the source region, the vertical channel and the drain region are located at the same plane and are all attached to an upper surface of the substrate layer, upper surfaces of the source region, the vertical channel and the drain region are located at the same plane, front surfaces of the source region, the vertical channel and the drain region are located at the same plane, back surfaces of the source region, the vertical channel and the drain region are located at the same plane, a right surface of the source region is fixed and attached to a left surface of the vertical channel, and a right surface of the vertical channel is fixed and attached to a left surface of the drain region; the first gate-oxide layer is rectangular and is located at a front side of the vertical channel, a lower surface of the first gate-oxide layer is attached to the upper surface of the substrate layer, a left surface of the first gate-oxide layer is aligned with the left surface of the vertical channel, a right surface of the first oxide-gate layer is aligned with the right surface of the vertical channel, and a back surface of the first gate-oxide layer is fixed and attached to the front surface of the vertical channel; the first metal layer is rectangular and is located at a front side of the first gate-oxide layer, a lower surface of the first metal layer is attached to the upper surface of the substrate layer, a left surface of the first metal layer is aligned with the left surface of the vertical channel, a right surface of the first metal layer is aligned with the right surface of the vertical channel, a back surface of the first metal layer is fixed and attached to a front surface of the first gate-oxide layer, the second gate-oxide layer, the third gate-oxide layer, the fourth gate-oxide layer, the fifth gate-oxide layer, the second metal layer, the third metal layer and the horizontal channel are all rectangular and are respectively located at a back side of the vertical channel, the second metal layer, the second gate-oxide layer, the horizontal channel, the third gate-oxide layer and the third metal layer are stacked from top to bottom, left surfaces of the second metal layer, the second gate-oxide layer, the horizontal channel, the third gate-oxide layer and the third metal layer are all aligned with the left surface of the vertical channel, right surfaces of the second metal layer, the second gate-oxide layer, the horizontal channel, the third gate-oxide layer and the third metal layer are all aligned with the right surface of the vertical channel, back surfaces of the second metal layer, the second gate-oxide layer, the horizontal channel, the third gate-oxide layer and the third metal layer are located in a same plane, front surfaces of the second gate-oxide layer, the horizontal channel and the third gate-oxide layer are fixed and attached to the back surface of the vertical channel, the fourth gate-oxide layer is located at a front side of the second metal layer and an upper side of the second gate-oxide layer, a front surface of the fourth gate-oxide layer is fixed and attached to the back surface of the vertical channel, a back surface of the fourth gate-oxide layer is fixed and attached to a front surface of the second metal layer, a left surface of the fourth gate-oxide layer is aligned with the left surface of the second metal layer, a right surface of the fourth gate-oxide layer is aligned with the right surface of the second metal layer, an upper surface of the fourth gate-oxide layer is aligned with an upper surface of the second metal layer, a lower surface of the fourth gate-oxide layer is fixed and attached to an upper surface of the second gate-oxide layer, the fifth gate-oxide layer is located at a front side of the third metal layer and a lower side of the third gate-oxide layer, a front surface of the fifth gate-oxide layer is fixed and attached to the back surface of the vertical channel, a back surface of the fifth gate-oxide layer is fixed and attached to a front surface of the third metal layer, a left surface of the fifth gate-oxide layer is aligned with the left surface of the third metal layer, a right surface of the fifth gate-oxide layer is aligned with the right surface of the third metal layer, an upper surface of the fifth gate-oxide layer is fixed and attached to a lower surface of the third gate-oxide layer, and a lower surface of the fifth gate-oxide layer is fixed and attached to the upper surface of the substrate layer; the second metal layer and the third metal layer are symmetrical in an up-and-down direction, the second gate-oxide layer and the third gate-oxide layer are symmetrical in the up-and-down direction, and the fourth gate-oxide layer and the fifth gate-oxide layer are symmetrical in the up-and-down direction; and the first metal layer is a first gate of the TFET, the second metal layer is a second gate of the TFET, and the third metal layer is a third gate of the TFET.

The substrate layer is made from silicon; the source region is made from silicon, the doping concentration of the source region is $1*10^{21}$ cm$^{-3}$, the height of the source region in an up-and-down direction is 80 nm, the thickness of the source region in a front-and-back direction is 10 nm, the length of the source region in a left-and-right direction is 40 nm; the vertical channel is made from silicon, the doping concentration of the vertical channel is $1*10^{14}$ cm$^{-3}$, the height of the vertical channel in the up-and-down direction is 80 nm, the thickness of the vertical channel in the front-and-back direction is 10 nm, and the length of the vertical channel in the left-and-right direction is 40 nm; the horizontal channel is made from silicon, the doping concentration of the horizontal channel is $1*10^{14}$ cm$^{-3}$, the height of the horizontal channel in the up-and-down direction is 15 nm, the thickness of the horizontal channel in the front-and-back direction is 30 nm, and the length of the horizontal channel in the left-and-right direction is 40 nm; the drain region is made from silicon, the doping concentration of the drain region is $1*10^{20}$ cm$^{-3}$, the height of the drain region in the up-and-down direction is 80 nm, the thickness of the drain region in the front-and-back direction is 10 nm, and the length of the drain region in the left-and-right direction is 40 nm; the first gate-oxide layer is made from silicon dioxide, the height of the first gate-oxide layer in the up-and-down direction is 80 nm, the thickness of the first gate-oxide layer in the front-and-back direction is 2.5 nm, and the length of the first gate-oxide layer in the left-and-right direction is 40 nm; the first metal layer is made from polysilicon, the height of the first metal layer in the up-and-down direction is 80 nm, the thickness of the first metal layer in the front-and-back direction is 10 nm, the length of the first metal layer in the left-and-right direction is 40 nm, and a gate work function of the first metal layer is 5.2 eV; the second metal layer is made from polysilicon, the height of the second metal layer in the up-and-down direction is 30 nm, the thickness of the second metal layer in the front-and-back direction is 27.5 nm, the length of the second metal layer in the left-and-right direction is 40 nm, and a gate work function of the second metal layer is 5.0 eV; the third metal layer is made from polysilicon, the height of the third metal layer in the up-and-down direction is 30 nm, the thickness of the third metal layer in the front-and-back direction is 27.5 nm, the length of the third metal layer in the left-andright direction is 40 nm, and a gate work function of the third metal layer is 5.0 eV; the second gate-oxide layer is made from silicon dioxide, the height of the second gate-oxide layer in the up-and-down direction is 2.5 nm, the thickness of the second gate-oxide layer in the front-and-back direction is 30 nm, and the length of the second gate-oxide layer in the left-and-right direction is 40 nm; the third gate-oxide layer is made from silicon dioxide, the height of the third gate-oxide layer in the up-and-down direction is 2.5 nm, the thickness of the third gate-oxide layer in the front-and-back direction is 30 nm, and the length of the third gate-oxide layer in the left-and-right direction is 40 nm; the fourth gate-oxide layer is made from silicon dioxide, the height of the fourth gate-oxide layer in the up-and-down direction is 30 nm, the thickness of the fourth gate-oxide layer in the front-and-back direction is 2.5 nm, and the length of the fourth gate-oxide layer in the left-and-right direction is 40 nm; and the fifth gate-oxide layer is made from silicon dioxide, the height of the fifth gate-oxide layer in the up-and-down direction is 30 nm, the thickness of the fifth gate-oxide layer in the front-and-back direction is 2.5 nm, and the length of the fifth gate-oxide layer in the left-and-right direction is 40 nm.

Compared with the prior art, the invention has the following advantages: the horizontal channel and the vertical channel are arranged in different directions, and based on such an arrangement of the horizontal channel and the vertical channel, the three metal layers, namely the three gates, are not connected and will not be affected by each other, and the three gates can control the current of the whole channel jointly; the thickness of the vertical channel is set to belong the category of the thickness of the thin body, the potential of an upper region (i.e., the region between the first gate and the second gate) of the vertical channel can be controlled by means of the strong coupling between the first gate and the second gate, and the first gate and the second gate are made from polysilicon with high work functions, so a current will pass through this region only when the first gate and the second gate are both at a high level, and the TFET will be turned on when the first gate and the second gate are both at a high level; similarly, the potential of a lower region (i.e., the region between the first gate and the third gate) of the vertical channel can be controlled by means of the strong coupling between the first gate and the third gate, and the first gate and the third gate are made from polysilicon with high work functions, so a current will pass through this region only when the first gate and the third gate are both at a high level, and the TFET will be turned on when the first gate and the third gate are both at a high level; the horizontal channel not only isolates the second gate from the third gate, but also reduces the strength of coupling between the second gate and the third gate, and by weakening the coupling between the second gate and the third gate, only a small current passes through the horizontal channel when the second gate and the third gate are both at high levels, so the TFET will not be turned on at this moment. Therefore, a single TFET with an OR-AND logic function provided by the invention can show an OR-AND logic behavior, which is logically equivalent to (A+B)*C, and shows a three-input OR-AND logic behavior which cannot be realized by traditional single-gate and double-gate TFETs, where A, B and C are logic values respectively. Compared with OR-AND logic circuits realized by traditional TFETs, a single one of the TFET with the OR-AND logic function of the present invention can realize a three-input OR-AND circuit, such that the number of transistors in the three-input OR-AND circuit is reduced while the power consumption is reduced as well.

DESCRIPTION OF THE EMBODIMENTS

The invention will be described in further detail below in conjunction with the accompanying drawings and embodiments.

Figure 1:
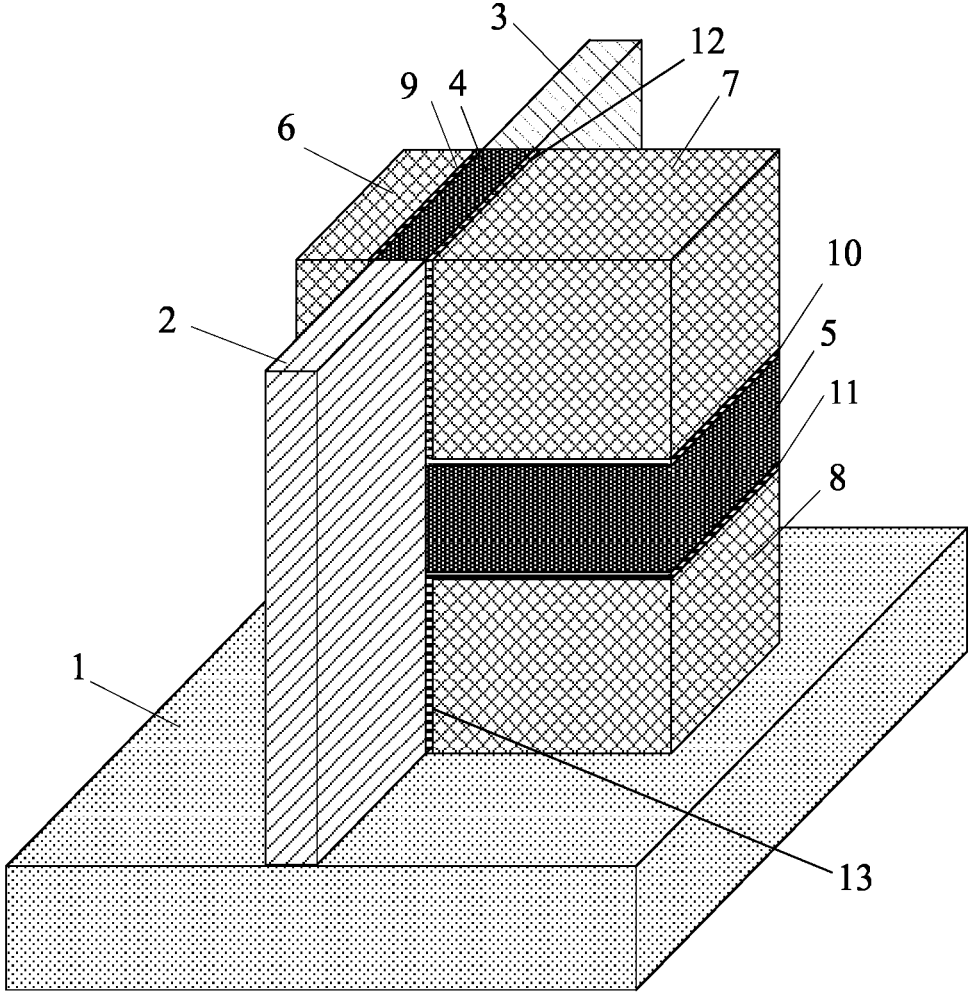
FIG. 1 is a three-dimensional view of a TFET with an OR-AND logic function according to the invention.
Figure 2:
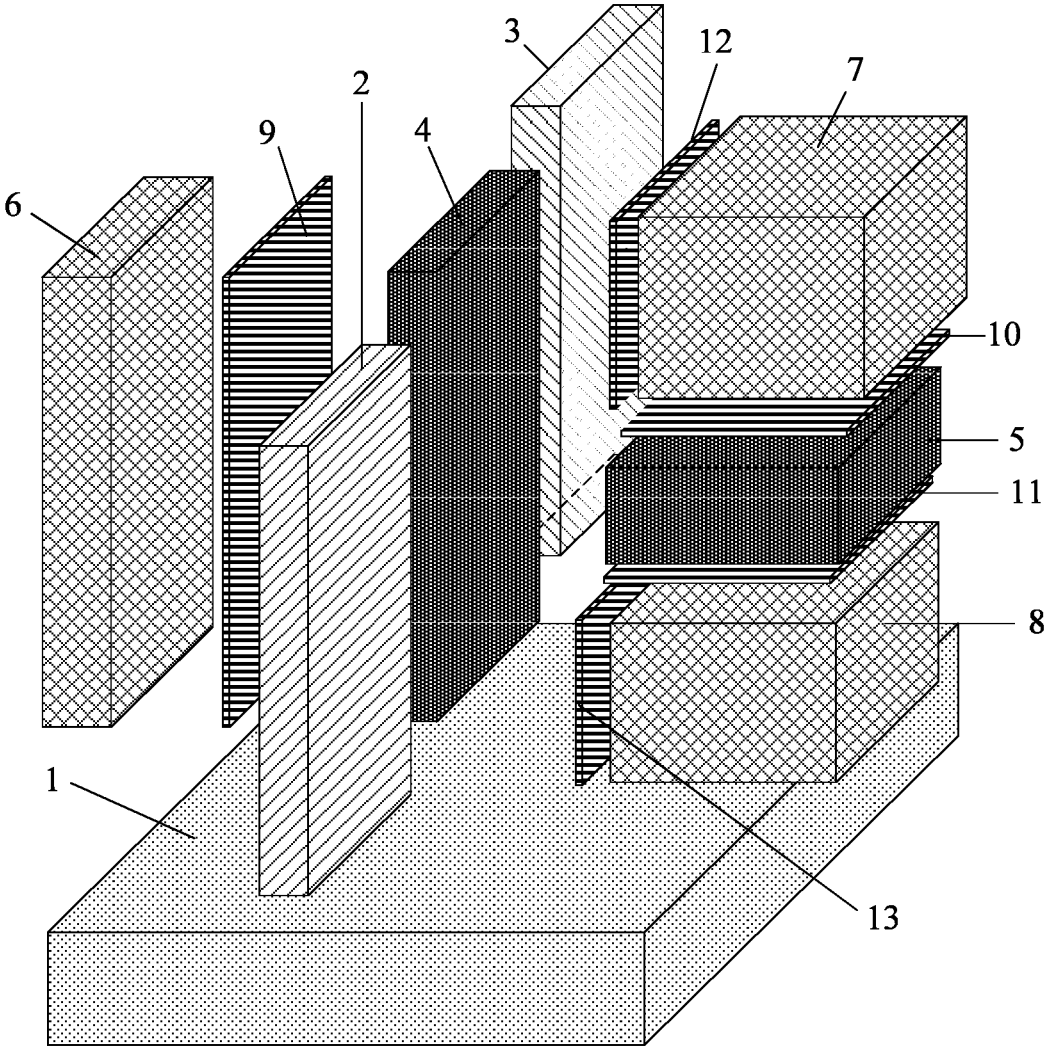
FIG. 2 is an exploded view of the TFET with an OR-AND logic function according to the invention.

Embodiment: As shown in FIG. 1 and FIG. 2, a TFET with an OR-AND logic function comprises a substrate layer 1, a source region 2, a drain region 3 and a channel region. The channel region comprises a vertical channel 4 and a horizontal channel 5. The TFET further comprises three metal layers and five gate-oxide layers. The three metal layers are referred to as a first metal layer 6, a second metal layer 7 and a third metal layer 8 respectively. The five gate-oxide layers are referred to as a first gate-oxide layer 9, a second gate-oxide layer 10, a third gate-oxide layer 11, a fourth gate-oxide layer 12 and a fifth gate-oxide layer 13 respectively. The source region 2, the vertical channel 4 and the drain region 3 are distributed on the substrate layer 1 from left to right and are all rectangular. Lower surfaces of the source region 2, the vertical channel 4 and the drain region 3 are located at the same plane and are all attached to an upper surface of the substrate layer 1. Upper surfaces of the source region 2, the vertical channel 4 and the drain region 3 are located at the same plane. Front surfaces of the source region 2, the vertical channel 4 and the drain region 3 are located at the same plane. Back surfaces of the source region 2, the vertical channel 4 and the drain region 3 are located at the same plane. A right surface of the source region 2 is fixed and attached to a left surface of the vertical channel 4. A right surface of the vertical channel 4 is fixed and attached to a left surface of the drain region 3. The first gate-oxide layer 9 is rectangular and is located at a front side of the vertical channel 4. A lower surface of the first gate-oxide layer 9 is attached to the upper surface of the substrate layer 1, a left surface of the first gate-oxide layer 9 is aligned with the left surface of the vertical channel 4, a right surface of the first oxide-gate layer 9 is aligned with the right surface of the vertical channel 4, and a back surface of the first gate-oxide layer 9 is fixed and attached to the front surface of the vertical channel 4. The first metal layer 6 is rectangular and is located at a front side of the first gate-oxide layer 9, a lower surface of the first metal layer 6 is attached to the upper surface of the substrate layer 1, a left surface of the first metal layer 6 is aligned with the left surface of the vertical channel 4, a right surface of the first metal layer 6 is aligned with the right surface of the vertical channel 4, a back surface of the first metal layer 6 is fixed and attached to a front surface of the first gate-oxide layer 9. The second gate-oxide layer 10, the third gate-oxide layer 11, the fourth gate-oxide layer 12, the fifth gate-oxide layer 13, the second metal layer 7, the third metal layer 8 and the horizontal channel 5 are all rectangular and are located at a back side of the vertical channel 4. The second metal layer 7, the second gate-oxide layer 10, the horizontal channel 5, the third gate-oxide layer 11 and the third metal layer 8 are stacked from top to bottom. Left surfaces of the second metal layer 7, the second gate-oxide layer 10, the horizontal channel 5, the third gate-oxide layer 11 and the third metal layer 8 are all aligned with the left surface of the vertical channel 4. Right surfaces of the second metal layer 7, the second gate-oxide layer 10, the horizontal channel 5, the third gate-oxide layer 11 and the third metal layer 8 are all aligned with the right surface of the vertical channel 4. Back surfaces of the second metal layer 7, the second gate-oxide layer 10, the horizontal channel 5, the third gate-oxide layer 11 and the third metal layer 8 are located at the same plane. Front surfaces of the second gate-oxide layer 10, the horizontal channel 5 and the third gate-oxide layer 11 are fixed and attached to the back surface of the vertical channel 4. The fourth gate-oxide layer 12 is located at a front side of the second metal layer 7 and an upper side of the second gate-oxide layer 10. A front surface of the fourth gate-oxide layer 12 is fixed and attached to the back surface of the vertical channel 4, a back surface of the fourth gate-oxide layer 12 is fixed and attached to a front surface of the second metal layer 7, a left surface of the fourth gate-oxide layer 12 is aligned with the left surface of the second metal layer 7, a right surface of the fourth gate-oxide layer 12 is aligned with the right surface of the second metal layer 7, an upper surface of the fourth gate-oxide layer 12 is aligned with an upper surface of the second metal layer 7, and a lower surface of the fourth gate-oxide layer 12 is fixed and attached to an upper surface of the second gate-oxide layer 10. The fifth gate-oxide layer 13 is located at a front side of the third metal layer 8 and a lower side of the third gate-oxide layer 11. A front surface of the fifth gate-oxide layer 13 is fixed and attached to the back surface of the vertical channel 4, a back surface of the fifth gate-oxide layer 13 is fixed and attached to a front surface of the third metal layer 8, a left surface of the fifth gate-oxide layer 13 is aligned with the left surface of the third metal layer 8, a right surface of the fifth gate-oxide layer 13 is aligned with the right surface of the third metal layer 8, an upper surface of the fifth gate-oxide layer 13 is fixed and attached to a lower surface of the third gate-oxide layer 11, and a lower surface of the fifth gate-oxide layer 13 is fixed and attached to the upper surface of the substrate layer 1. The second metal layer 7 and the third metal layer 8 are symmetrical in an up-and-down direction. The second gate-oxide layer 10 and the third gate-oxide layer 11 are symmetrical in the up-and-down direction. The fourth gate-oxide layer 12 and the fifth gate-oxide layer 13 are symmetrical in the up-and-down direction. The first metal layer 6 is a first gate of the TFET, the second metal layer 7 is a second gate of the TFET, and the third metal layer 8 is a third gate of the TFET.

According to the TFET with the OR-AND logic function in this embodiment, the substrate layer 1 is made from silicon; the source region 2 is made from silicon, the doping concentration of the source region 2 is $1*10^{21}$ cm$^{-3}$, the height of the source region 2 in an up-and-down direction is 80 nm, the thickness of the source region 2 in a front-andback direction is 10 nm, the length of the source region 2 in a left-and-right direction is 40 nm; the vertical channel 4 is made from silicon, the doping concentration of the vertical channel 4 is $1*10^{14}$ cm$^{-3}$, the height of the vertical channel 4 in the up-and-down direction is 80 nm, the thickness of the vertical channel 4 in the front-and-back direction is 10 nm, and the length of the vertical channel 4 in the left-and-right direction is 40 nm; the horizontal channel 5 is made from silicon, the doping concentration of the horizontal channel 5 is $1*10^{14}$ cm$^{-3}$, the height of the horizontal channel 5 in the up-and-down direction is 15 nm, the thickness of the horizontal channel 5 in the front-and-back direction is 30 nm, and the length of the horizontal channel 5 in the left-and-right direction is 40 nm; the drain region 3 is made from silicon, the doping concentration of the drain region 3 is $1*10^{20}$ cm$^{-3}$, the height of the drain region 3 in the up-and-down direction is 80 nm, the thickness of the drain region 3 in the front-and-back direction is 10 nm, and the length of the drain region 3 in the left-and-right direction is 40 nm; the first gate-oxide layer 9 is made from silicon dioxide, the height of the first gate-oxide layer 9 in the up-and-down direction is 80 nm, the thickness of the first gate-oxide layer 9 in the front-and-back direction is 2.5 nm, and the length of the first gate-oxide layer 9 in the left-and-right direction is 40 nm; the first metal layer 6 is made from polysilicon, the height of the first metal layer 6 in the up-and-down direction is 80 nm, the thickness of the first metal layer 6 in the front-and-back direction is 10 nm, the length of the first metal layer 6 in the left-and-right direction is 40 nm, and a gate work function of the first metal layer 6 is 5.2 eV; the second metal layer 7 is made from polysilicon, the height of the second metal layer 7 in the up-and-down direction is 30 nm, the thickness of the second metal layer 7 in the front-and-back direction is 27.5 nm, the length of the second metal layer 7 in the left-and-right direction is 40 nm, and a gate work function of the second metal layer 7 is 5.0 eV; the third metal layer 8 is made from polysilicon, the height of the third metal layer 8 in the up-and-down direction is 30 nm, the thickness of the third metal layer 8 in the front-and-back direction is 27.5 nm, the length of the third metal layer 8 in the left-and-right direction is 40 nm, and a gate work function of the third metal layer 8 is 5.0 eV; the second gate-oxide layer 10 is made from silicon dioxide, the height of the second gate-oxide layer 10 in the up-and-down direction is 2.5 nm, the thickness of the second gate-oxide layer 10 in the front-and-back direction is 30 nm, and the length of the second gate-oxide layer 10 in the left-and-right direction is 40 nm; the third gate-oxide layer 11 is made from silicon dioxide, the height of the third gate-oxide layer 11 in the up-and-down direction is 2.5 nm, the thickness of the third gate-oxide layer 11 in the front-and-back direction is 30 nm, and the length of the third gate-oxide layer 11 in the left-and-right direction is 40 nm; the fourth gate-oxide layer 12 is made from silicon dioxide, the height of the fourth gate-oxide layer 12 in the up-and-down direction is 30 nm, the thickness of the fourth gate-oxide layer 12 in the front-and-back direction is 2.5 nm, and the length of the fourth gate-oxide layer 12 in the left-and-right direction is 40 nm; and the fifth gate-oxide layer 13 is made from silicon dioxide, the height of the fifth gate-oxide layer 13 in the up-and-down direction is 30 nm, the thickness of the fifth gate-oxide layer 13 in the front-and-back direction is 2.5 nm, and the length of the fifth gate-oxide layer 13 in the left-and-right direction is 40 nm.

According to the TFET with an OR-AND logic function, the horizontal channel 5 and the vertical channel 4 are arranged in different directions, and based on such an arrangement of the horizontal channel 5 and the vertical channel 4, the three metal layers, namely the three gates, are not connected and will not be affected by each other, and the three gates can control the current of a whole channel jointly; the thickness of the vertical channel 4 is set to 10 nm, belonging to the category of the thickness of the thin body, the potential of an upper region (i.e., the region between the first gate and the second gate) of the vertical channel 4 can be controlled by means of the strong coupling between the first gate and the second gate, and the first gate and the second gate are made from polysilicon with high work functions, so a current will pass through this region only when the first gate and the second gate are both at a high level, and the TFET will be turned on when the first gate and the second gate are both at a high level; similarly, the potential of a lower region (i.e., the region between the first gate and the third gate) of the vertical channel 4 can be controlled by means of the strong coupling between the first gate and the third gate, and the first gate and the third gate are made from polysilicon with high work functions, so a current will pass through this region only when the first gate and the third gate are both at a high level, and the TFET will be turned on when the first gate and the third gate are both at a high level; the horizontal channel 5 not only isolates the second gate from the third gate, but also reduces the strength of coupling between the second gate and the third gate, and by weakening the coupling between the second gate and the third gate, only a small current passes through the horizontal channel 5 when the second gate and the third gate are both at a high level, so the TFET will not be turned on at this moment. Therefore, a single TFET with an OR-AND logic function provided by the invention can show an OR-AND logic behavior, which is logically equivalent to (A+B)*C, and shows a three-input OR-AND logic behavior which cannot be realized by traditional single-gate and double-gate TFETs, where A, B and C are logic values respectively.

Figure 3:
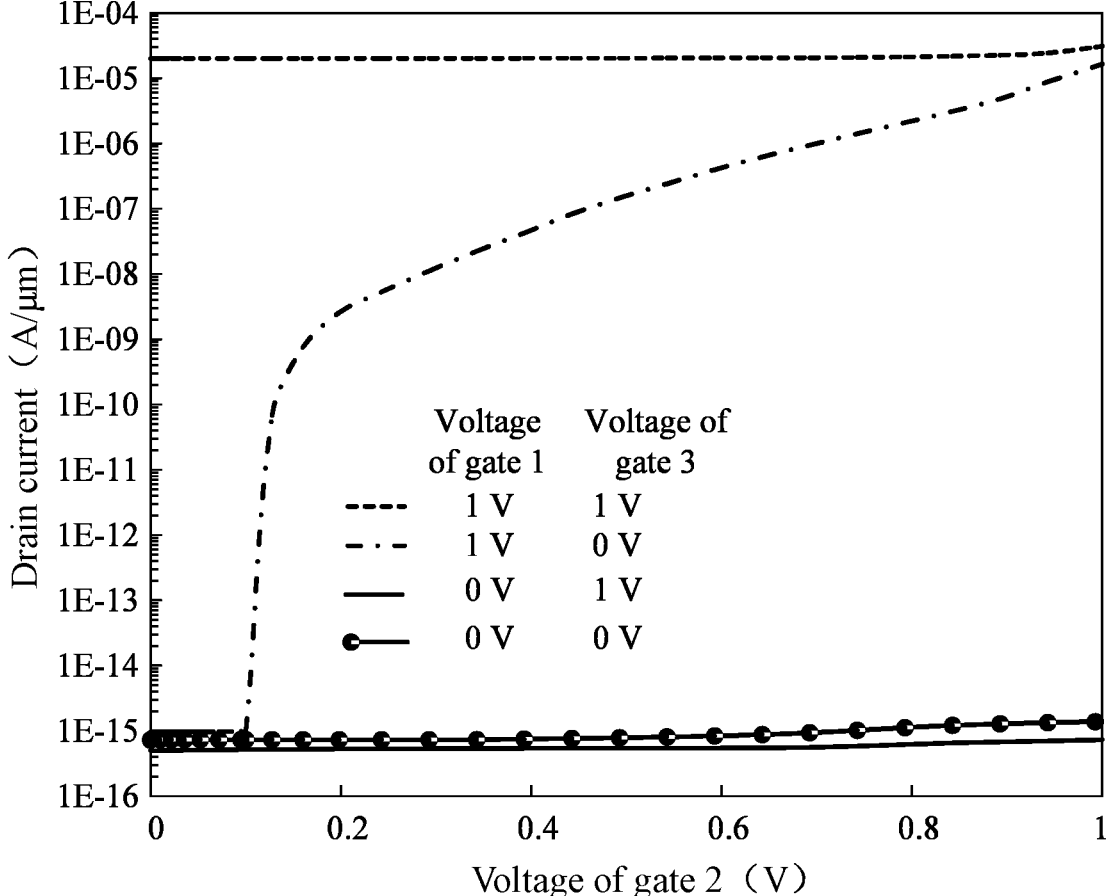
FIG. 3 illustrates a scan curve obtained by in a case where a first gate and a third gate of the TFET with an OR-AND logic function are fixed at a high level (1V) or a low level (0V) and a second gate of the TFET with an OR-AND logic function is scanned with the scanning voltage increasing from 0V to 1V, in a TCAD environment.
Figure 4:
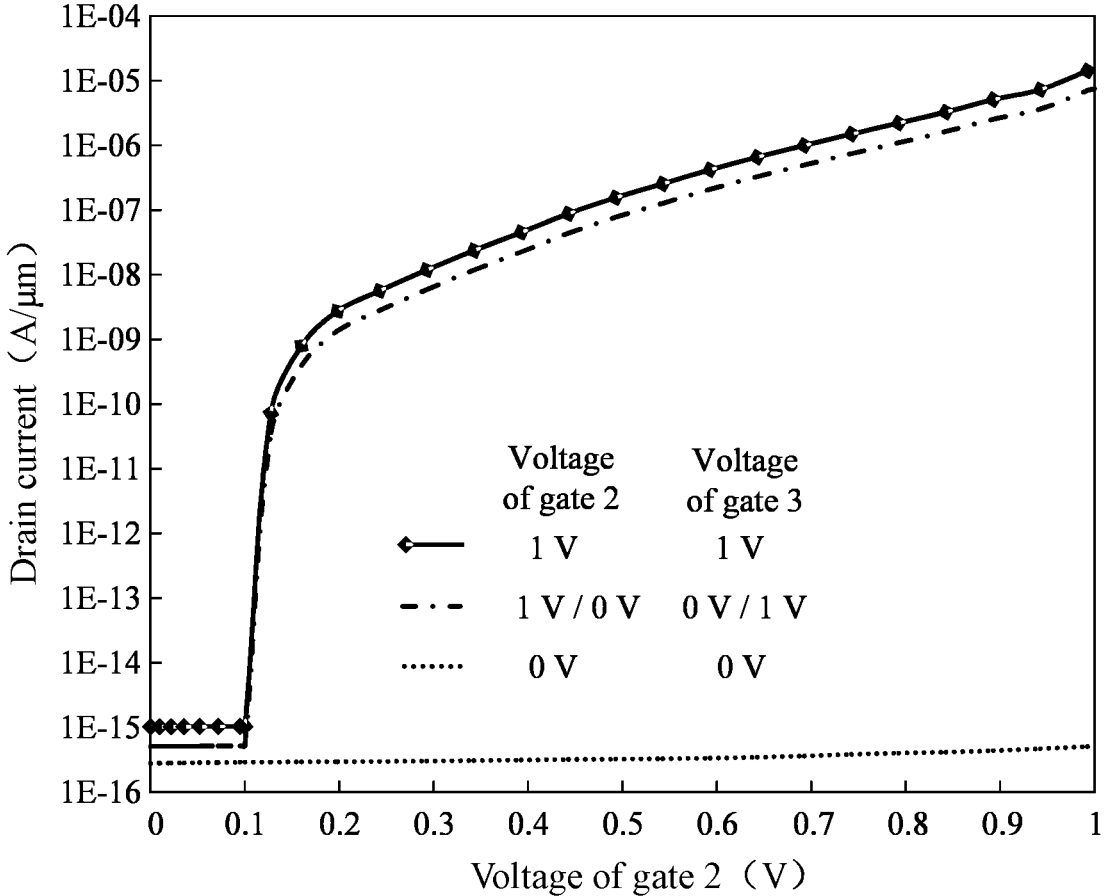
FIG. 4 illustrates a scan curve obtained by in a case where the second gate and the third gate of the TFET with an OR-AND logic function are fixed at a high level (1V) or a low level (0V) and the first gate of the TFET with an OR-AND logic function is scanned with the scanning voltage increasing from 0V to 1V, in the TCAD environment.

Numerical simulation is carried out on the TFET with an OR-AND logic function provided by the invention. The first gate and the third gate are fixed at a high level (1V) or a low level (0V), only the second gate is scanned with the scanning voltage increasing from 0V to 1V, and a scan curve obtained in this case is shown in FIG. 3. The second gate and the third gate are fixed at a high level (1V) or a low level (0V), only the first gate is scanned with the scanning voltage increasing from 0V to 1V, and a scan curve obtained in this case is shown in FIG. 4. The drain currents of the TFET with an OR-AND logic function provided by the invention in the on/off state are extracted from FIG. 3 and FIG. 4, and are shown in Table 1.

TABLE 1

| Voltage of gate 1 | Voltage of gate 2 | Voltage of gate 3 | Drain current (A/μm) |
|---|---|---|---|
| 0 V | 0 V | 0 V | 2.79176E−16 |
| 0 V | 0 V | 1 V | 1.38954E−15 |
| 0 V | 1 V | 0 V | 1.38954E−15 |
| 0 V | 1 V | 1 V | 1.01918E−15 |
| 1 V | 0 V | 0 V | 5.09285E−16 |
| 1 V | 0 V | 1 V | 2.0097E−05 |
| 1 V | 1 V | 0 V | 2.0097E−05 |
| 1 V | 1 V | 1 V | 3.10311E−05 |

In FIG. 3, FIG. 4 and Table 1, the gate 1 corresponds to the first gate, the gate 2 corresponds to the second gate, and the gate 3 corresponds to the third gate. It can be known, by analyzing Table 1, that the TFET is turned on when the first gate is at a high level and the second gate and the third gate are not both at a low level, which conforms to the OR-AND logic behavior.

What is claimed is:

1. A tunnel field-effect transistor (TFET) with an OR-AND logic function comprising a substrate layer, a source region, a drain region and a channel region, and the channel region comprising a vertical channel and a horizontal channel, wherein:

the source region, the vertical channel and the drain region are distributed on the substrate layer from left to right and are all rectangular, lower surfaces of the source region, the vertical channel and the drain region are located at the same plane and are all attached to an upper surface of the substrate layer, upper surfaces of the source region, the vertical channel and the drain region are located at the same plane, front surfaces of the source region, the vertical channel and the drain region are located at the same plane, back surfaces of the source region, the vertical channel and the drain region are located at the same plane, a right surface of the source region is fixed and attached to a left surface of the vertical channel, and a right surface of the vertical channel is fixed and attached to a left surface of the drain region, and the TFET further comprises three metal layers and five gate-oxide layers, the three metal layers are referred to as a first metal layer, a second metal layer and a third metal layer respectively, the five gate-oxide layers are referred to as a first gate-oxide layer, a second gate-oxide layer, a third gate-oxide layer, a fourth gate-oxide layer and a fifth gate-oxide layer respectively, wherein:

the first gate-oxide layer is rectangular and is located at a front side of the vertical channel, a lower surface of the first gate-oxide layer is attached to the upper surface of the substrate layer, a left surface of the first gate-oxide layer is aligned with the left surface of the vertical channel, a right surface of the first oxide-gate layer is aligned with the right surface of the vertical channel, and a back surface of the first gate-oxide layer is fixed and attached to the front surface of the vertical channel;

the first metal layer is rectangular and is located at a front side of the first gate-oxide layer, a lower surface of the first metal layer is attached to the upper surface of the substrate layer, a left surface of the first metal layer is aligned with the left surface of the vertical channel, a right surface of the first metal layer is aligned with the right surface of the vertical channel, a back surface of the first metal layer is fixed and attached to a front surface of the first gate-oxide layer;

the second gate-oxide layer, the third gate-oxide layer, the fourth gate-oxide layer, the fifth gate-oxide layer, the second metal layer, the third metal layer and the horizontal channel are all rectangular and are respectively located at a back side of the vertical channel, the second metal layer, the second gate-oxide layer, the horizontal channel, the third gate-oxide layer and the third metal layer are stacked from top to bottom, left surfaces of the second metal layer, the second gate-oxide layer, the horizontal channel, the third gate-oxide layer and the third metal layer are all aligned with the left surface of the vertical channel, right surfaces of the second metal layer, the second gate-oxide layer, the horizontal channel, the third gate-oxide layer and the third metal layer are all aligned with the right surface of the vertical channel, back surfaces of the second metal layer, the second gate-oxide layer, the horizontal channel, the third gate-oxide layer and the third metal layer are located at the same plane, front surfaces of the second gate-oxide layer, the horizontal channel and the third gate-oxide layer are respectively fixed and attached to the back surface of the vertical channel, the fourth gate-oxide layer is located at a front side of the second metal layer and an upper side of the second gate-oxide layer, a front surface of the fourth gate-oxide layer is fixed and attached to the back surface of the vertical channel, a back surface of the fourth gate-oxide layer is fixed and attached to a front surface of the second metal layer, a left surface of the fourth gate-oxide layer is aligned with the left surface of the second metal layer, a right surface of the fourth gate-oxide layer is aligned with the right surface of the second metal layer, an upper surface of the fourth gate-oxide layer is aligned with an upper surface of the second metal layer, a lower surface of the fourth gate-oxide layer is fixed and attached to an upper surface of the second gate-oxide layer, the fifth gate-oxide layer is located at a front side of the third metal layer and a lower side of the third gate-oxide layer, a front surface of the fifth gate-oxide layer is fixed and attached to the back surface of the vertical channel, a back surface of the fifth gate-oxide layer is fixed and attached to a front surface of the third metal layer, a left surface of the fifth gate-oxide layer is aligned with the left surface of the third metal layer, a right surface of the fifth gate-oxide layer is aligned with the right surface of the third metal layer, an upper surface of the fifth gate-oxide layer is fixed and attached to a lower surface of the third gate-oxide layer, and a lower surface of the fifth gate-oxide layer is fixed and attached to the upper surface of the substrate layer;

the second metal layer and the third metal layer are symmetrical in an up-and-down direction, the second gate-oxide layer and the third gate-oxide layer are symmetrical in the up-and-down direction, and the fourth gate-oxide and the fifth gate-oxide layer are symmetrical in the up-and-down direction; and the first metal layer is a first gate of the TFET, the second metal layer is a second gate of the TFET, and the third metal layer is a third gate of the TFET.

2. The TFET with the OR-AND logic function according to claim 1, wherein:

the substrate layer is made from silicon;

the source region is made from silicon, the doping concentration of the source region is $1*10^{21}$ cm$^{-3}$, the height of the source region in the up-and-down direction is 80 nm, the thickness of the source region in a front-and-back direction is 10 nm, the length of the source region in a left-and-right direction is 40 nm;

the vertical channel is made from silicon, the doping concentration of the vertical channel is $1*10^{14}$ cm$^{-3}$, the height of the vertical channel in the up-and-down direction is 80 nm, the thickness of the vertical channel in the front-and-back direction is 10 nm, and the length of the vertical channel in the left-and-right direction is 40 nm;

the horizontal channel is made from silicon, the doping concentration of the horizontal channel is $1*10^{14}$ cm$^{-3}$, the height of the horizontal channel in the up-and-down direction is 15 nm, the thickness of the horizontal channel in the front-and-back direction is 30 nm, and the length of the horizontal channel in the left-and-right direction is 40 nm;

the drain region is made from silicon, the doping concentration of the drain region is $1*10^{20}$ cm$^{-3}$, the height of the drain region in the up-and-down direction is 80 nm, the thickness of the drain region in the front-and-back direction is 10 nm, and the length of the drain region in the left-and-right direction is 40 nm;

the first gate-oxide layer is made from silicon dioxide, the height of the first gate-oxide layer in the up-and-down direction is 80 nm, the thickness of the first gate-oxide layer in the front-and-back direction is 2.5 nm, and the length of the first gate-oxide layer in the left-and-right direction is 40 nm;

the first metal layer is made from polysilicon, the height of the first metal layer in the up-and-down direction is 80 nm, the thickness of the first metal layer in the front-and-back direction is 10 nm, the length of the first metal layer in the left-and-right direction is 40 nm, and a gate work function of the first metal layer is 5.2 eV;

the second metal layer is made from polysilicon, the height of the second metal layer in the up-and-down direction is 30 nm, the thickness of the second metal layer in the front-and-back direction is 27.5 nm, the length of the second metal layer in the left-and-right direction is 40 nm, and a gate work function of the second metal layer is 5.0 eV;

the third metal layer is made from polysilicon, the height of the third metal layer in the up-and-down direction is 30 nm, the thickness of the third metal layer in the front-and-back direction is 27.5 nm, the length of the third metal layer in the left-and-right direction is 40 nm, and a gate work function of the third metal layer is 5.0 eV;

the second gate-oxide layer is made from silicon dioxide, the height of the second gate-oxide layer in the up-and-down direction is 2.5 nm, the thickness of the second gate-oxide layer in the front-and-back direction is 30 nm, and the length of the second gate-oxide layer in the left-and-right direction is 40 nm;

the third gate-oxide layer is made from silicon dioxide, the height of the third gate-oxide layer in the up-and-down direction is 2.5 nm, the thickness of the third gate-oxide layer in the front-and-back direction is 30 nm, and the length of the third gate-oxide layer in the left-and-right direction is 40 nm;

the fourth gate-oxide layer is made from silicon dioxide, the height of the fourth gate-oxide layer in the up-and-down direction is 30 nm, the thickness of the fourth gate-oxide layer in the front-and-back direction is 2.5 nm, and the length of the fourth gate-oxide layer in the left-and-right direction is 40 nm; and the fifth gate-oxide layer is made from silicon dioxide, the height of the fifth gate-oxide layer in the up-and-down direction is 30 nm, the thickness of the fifth gate-oxide layer in the front-and-back direction is 2.5 nm, and the length of the fifth gate-oxide layer in the left-and-right direction is 40 nm.

* * * * *